United States Patent [19]
Saito

[11] Patent Number: 5,622,891
[45] Date of Patent: Apr. 22, 1997

[54] METHOD OF MANUFACTURING SEMICONDUCTOR DEVICE WITH REDUCED SIDE GATE EFFECT

[75] Inventor: Junji Saito, Yamahashi, Japan

[73] Assignee: Fujitsu Limited, Kawasaki, Japan

[21] Appl. No.: 352,771

[22] Filed: Dec. 1, 1994

Related U.S. Application Data

[62] Division of Ser. No. 88,337, Jul. 9, 1993.

[30] Foreign Application Priority Data

Jul. 10, 1992 [JP] Japan .................................. 4-183408

[51] Int. Cl.$^6$ ................................................ H01L 21/208
[52] U.S. Cl. ........................... 438/172; 117/84; 438/492; 438/571
[58] Field of Search ................................... 437/129, 126, 437/133; 148/DIG. 56; 117/84

[56] References Cited

U.S. PATENT DOCUMENTS

| | | | |
|---|---|---|---|
| 4,716,125 | 12/1987 | Makiuchi | 372/47 |
| 5,021,857 | 6/1991 | Suehiro | 257/194 |
| 5,204,871 | 4/1993 | Larkins | 372/45 |
| 5,274,257 | 12/1993 | Kim et al. | 257/192 |
| 5,276,340 | 1/1994 | Yokoyama et al. | 257/194 |

FOREIGN PATENT DOCUMENTS

| | | | |
|---|---|---|---|
| 0352472 | 1/1990 | European Pat. Off. . | |
| 0371686 | 6/1990 | European Pat. Off. . | |
| 60-144949 | 7/1985 | Japan | 257/347 |
| 63-200564 | 8/1988 | Japan | 257/195 |
| 1-150378 | 6/1989 | Japan . | |
| 3-133182 | 6/1991 | Japan . | |

OTHER PUBLICATIONS

Kuromiya et al., "Vacuum Chemical Epitaxy," *Solid State Technology* (Japanese Version), Feb. 1990, pp. 21–27.

Saito et al., "Effects of Etching with a Mixture of HCl Gas and $H_2$ on the GaAs Surface Cleaning in Molecular–Beam Epitaxy," *Reprinted from J. Appl. Phys*, vol. 67, No. 10, May 15, 1990, pp. 6274–6280.

Warren et al., "Arsenic Precipitates and the Semi-Insulating Properties of GaAs Buffer Layers Grown by Low–Temperature Molecular Beam Epitaxy," *Appl. Phys. Lett.*, vol. 57, No. 13, Sep. 24, 1990, pp. 1331–1333.

Melloch et al., "Formation of Arsenic Precipitates in GaAs Buffer Layers Grown by Molecular, Beam Epitaxy at Low Substrate Temperatures," *Appl. Phys. Lett.*, vol. 57, No. 15, Oct. 8, 1990, pp. 1331–1333.

Melloch et al., "GaAs Buffer Layers Grown at Low Substrate Temperatures using $As_2$ and the Formation of Arsenic Precipitates," *Journal of Crystal Growth*, vol. 111, 1991, pp. 39–42.

Tokumitsu et al., "Preparation of GaAs and $Ga_{1-x}Al_xAs$ Multi–Layer Structures by Metalorganic Molecular Beam Epitaxy," *Japanese Journal of Applied Physics*, vol. 25, No. 8, Aug. 1986, pp. 1211–1215.

(List continued on next page.)

*Primary Examiner*—R. Bruce Breneman
*Attorney, Agent, or Firm*—Staas & Halsey

[57] ABSTRACT

A silicon nitride film 2 is formed on a GaAs substrate 1 and patterned to selectively expose the GaAS substrate surface in uniformly distributed areas having a width of not greater than 1 μm. A non-doped GaAs buffer layer is grown on the GaAs substrate to completely cover the silicon nitride film. Then, a semiconductor multilayer structure including a non-doped GaAs layer is formed on the non-doped GaAs buffer layer. When a semiconductor integrated circuit device is manufactured using this semiconductor substrate, side gate effect can be effectively reduced due to the existence of the silicon nitride pattern and the buffer layer.

20 Claims, 5 Drawing Sheets

OTHER PUBLICATIONS

Saito et al., "Effect of Thermal Etching on GaAs Substrate in Molecular Beam Epitaxy," *Japanese Journal of Applied Physics*, vol. 25, No. 8, Aug. 1986, pp. 1216–1220.

Yokohama et al., "Reduction of Backgating Effect in MBE-Grown GaAs/AlGaAs Hempt's," *IEEE Electron Device Letters*, vol. EDL-8, No. 6, Jun. 1987, pp.280–281.

Smith et al., "New MBE Buffer Used to Eliminate Backgating in GaAs Mesfet's," *IEEE Electron Device Letters*, vol. 9, No. 2, Feb. 1988, pp. 77–80.

Saito et al., "In Situ Cleaning of GaAs Substrates with HCl Gas and Hydrogen Mixture Prior to MBE Growth," *Reprinted from Journal of Crystal Growth*, vol. 95, 1989, pp. 322–327.

Hiruma et al., "Surface Migration and Reaction Mechanism During Selective Growth of GaAs and AIAs by Metalorganic Chemical Vapor Deposition," *Journal of Crystal Growth*, vol. 101, 1990, pp. 717–724.

M. Yazawa, M. Koguchi, and K. Hiruma; "Heteroepitaxial Ultrafine Wire–like Growth of InAs on GaAs Substrates"; Applied Physics Letters Mar. 11, 1991, No. 10, New York; pp. 1080–1082.

METHOD OF MANUFACTURING SEMICONDUCTOR DEVICE WITH REDUCED SIDE GATE EFFECT

This application is a division of application Ser. No. 08/088,337, filed Jul. 9, 1993.

BACKGROUND OF THE INVENTION

1. Field of the Invention

This invention relates to a semiconductor device and a method of making the same, and more particularly to a semiconductor device capable of reducing affects induced through a substrate or a buffer layer to an epitaxially grown layer such as an active layer grown thereon, and a method of making the same.

2. Description of the Related Art

Recently, novel electronic devices and optoelectronic devices are realized by growing epitaxial layers on a single crystal semiconductor substrate. The epitaxial layers consist of multilayer structure or supperlattice structure which require sophisticated control of doping and compositional profiles.

Molecular beam epitaxy (MBE), and metalorganic vapor phase epitaxy (MOVPE) have emerged as important and matured epitaxial growth for these devices.

When such a GaAs/n-AlGaAs hetero junction (or maltilayer structure) is grown in that a non-doped GaAs layer and a Si-doped AlGaAs layer form a hereto junction, a two dimensional electron gas (2 DEG) having a high electron mobility is generated at the hereto junction on the GaAs side. Field effect transistor (FET) having this 2 DEG layer as a channel layer is called high electron mobility transistor (HEMT).

The HEMT is one of the novel electronic devices realized by utilizing epitaxial growth technique. In these electronic devices, it is very important to enable control of electric characteristics of a channel or an active layer, and further to enable control of crystalinity at both a buffer layer and the interface between a substrate and the buffer layer. Thus, epitaxial growth technique capable of such control should be explored.

According to the conventional method of manufacturing HEMT, a wafer for making HEMT is made by growing an undoped GaAs layer having a thickness, for example, of 0.5–1.0 μm on a GaAs substrate and a Si-doped AlGaAs layer on the GaAs epitaxial layer, by MBE or MOVPE.

HEMT's are manufactured by processing this wafer. First, those portions of the wafer where gate electrodes are to be formed are subjected to dry etching to reduce the thickness of the Si-doped n-type AlGaAs to a predetermined value. Then, AuGe/Au laminated layers are formed on the wafer by physical deposition, patterned by photolithography, and alloyed to form ohmic source and drain electrodes on the both sides of each gate electrode portion.

Then, a resist mask having an aperture at each gate electrode portion is formed on the wafer. An aluminum electrode layer is deposited in vacuum and lifted off by the resist removal to form aluminum gate electrode at the gate electrode portion. HEMT structures are manufactured in this way.

When HEMT's are formed in an integrated circuit, such side gate effect (or back gate effect) is known to occur that adjacent devices interfere mutually.

For example, assume that a device A and a device B are located adjacent to each other and isolated by an isolation region formed by implanting oxygen ions into the wafer. When a voltage (side gate voltage) is applied between the source electrode of the device A and a certain electrode (side gate) of the device B, a leak current may be allowed to flow through the device A. As a result, the threshold voltage Vth of the device A varies. This phenomenon is the side gate effect.

The reason of this phenomenon can be considered as follows. There may exist interface levels in the neighborhood of the interface between the substrate and the epitaxially grown layer due to impurities, etc, or impurity levels in the buffer layer. Electrons or holes trapped at these levels can be excited by a high electric field to produce an electric current. When this electric field is originated by the voltage application in the adjacent device, the current may flow in a device not intended.

The present inventor and his colleague has found and reported that the side gate effect in the HEMT integrated circuit can be reduced by reducing impurities existing in the neighborhood of the interface between the substrate and the epitaxially grown layer.

Reference may be made to (1) T. Yokoyama et al "Reduction of Backgating Effect in HEMT's" IEEE Electron Device Letters. Vol. EDL-8, No.6, June 1987, pp 280–281, and (2) J. Saito et al "Effect of Thermal Etching on GaAs Substrate in Molecular Beam Epitaxy" Japan. J. Appln. Phys. Vol. 25, No.8, 1986, pp 1216–1220, which are incorporated herein by reference.

According to this technique, a GaAs substrate is heated to or above 750° C. under the irradiation of arsenic (As) molecular beam before crystal growth by MBE, to thermally etch the surface of the GaAs substrate by about 200–300 A. Residual impurities on the surface, such as carbon, can be removed by this thermal etching. Then, GaAs/n-AlGaAs hereto structure is formed on the cleaned GaAs substrate surface by MBE.

If epitaxial growth by MBE is done without thermal etching, residual impurities such as carbon on GaAs substrate surface may be incorporated into the epitaxially grown GaAs layer. As a result, shallow impurity levels can be produced the neighborhood of the interface between the substrate and the epitaxially grown layer.

The present inventor and his colleague have confirmed that such shallow impurity is mainly carbon (e.g. see above-mentioned article (2)). Carbon atoms produce acceptor levels by occupying As sites in the GaAs crystal. When there exist acceptor levels in a HEMT integrated circuit, a leak current can flow through the neighborhood of the interface between the substrate and the epitaxially grown layer by the application of a side gate voltage to a side gate electrode. Thus, variation of the threshold voltage can arise due to the side gate effect.

It is also confirmed that when HEMT's are made by cleaning the substrate surface by thermal etching and then performing epitaxial growth, the threshold voltage does not vary up to a side gate voltage of 60 V, when the distance to a side gate electrode is 100 μm (e.g. see above-mentioned article (1)).

A method of using a buffer layer grown at a low temperature is known to be effective for reducing the side gate effect (for example, see (3) F. W. Smith et al "New MBE Buffer Used to Eliminate Backgating in GaAs MESFET's" IEEE Electron Device Letters, Vol. 9, No. 2, Feb. 1988, pp 77–80).

According to this method, in the case of growing epitaxial layer structure for forming GaAs MESFET on GaAs substrate by MBE, first GaAs buffer layer is grown at a low temperature of 150° to 300° C., and then an n type GaAs active layer is grown thereon at a normal growth temperature of about 600° C.

In the MESFET's formed by using the epitaxial layer structure grown as described above, the threshold voltage of the MESFET does not change up to a side gate voltage of 30 V when the distance to a side gate electrode is 50 μm. Thus, the side gate effect can be reduced (e.g. see above-mentioned article (3)). Joint research group of IBM and Purdue University explains the reason of reducing the side gate effect by the use of epitaxial growth structure formed on a buffer layer grown at a low temperature as follows. In the GaAs buffer layer grown at a low temperature, arsenic (As) precipitates having a diameter of 20–100 A exist at a density above $10^{17}$ $cm^{-3}$. Buried Schottky barriers, which are metal-semiconductor interfaces, are formed in the GaAs layer by the existence of these As precipitates. Depletion layers due to these Schottky barriers extend throughout the GaAs layer and are connected to each other to exhibit high resistivity. (see (4) M. R. Melloch et al "Formation of Arsenic Precipitates in GaAs Buffer Layers Grown by Molecular Beam Epitaxy at Low Substrate Temperatures" Appl. Phys. Lett. Vol. 57 (1990) pp 1531–1533, (5) A. C. Warren et al "Arsenic Precipitates and the Semi-insulating Properties of GaAs Buffer layers Grown by Low Temperature Molecular Beam Epitaxy" Appl. Phys. Lett. Vol. 57 (1990) pp 1331–1333, and (6) M. R. Melloch et al "GaAs Buffer Layers Grown at Low Substrate Temperatures Using $As_2$ and the Formation of Arsenic Precipitates" Journal of Crystal Growth, Vol.111 (1991) pp 39–42.

It is not easy to control the process of first cleaning substrate surface by thermal etching and then performing epitaxial growth to reduce the side gate effect. That is, since GaAs substrate is heated to a high temperature of 750° C., dissociation of As selectively occurs simultaneously with the etching. Thus, surface morphology is degraded with the increase of etching, to produce surface roughness.

Normally, the etch rate in this case is about 70–100 A/min, when As pressure is $1.5 \times 10^{-5}$ torr. The each rate is dependant on the pressure of irradiating As beam. Reduction of the side gate effect is obtained when the etched amount is about 200–300 A. When etching is done deeper than this value, the surface morphology is degraded and manufacture of an integrated circuit becomes difficult.

According to the method of manufacturing an integrated circuit by first growing a buffer layer at a low temperature and then growing epitaxial layers thereon, it is necessary to first set the substrate temperature at a very low temperature of 150°–300° C. to grow a buffer layer, compared to 600° C. which is the ordinary substrate temperature for growing GaAs layer. This means that relatively long time is required for raising the substrate temperature after cleaning. Also, it is not easy to accurately control such a low temperature.

SUMMARY OF THE INVENTION

An object of this invention is to provide a method of manufacturing a semiconductor device capable of growing epitaxial layers which can reduce the side gate effect with good controllability.

According to one aspect of this invention, there is provided a semiconductor device comprising: a single crystal semiconductor substrate; an insulative film formed on said single crystal semiconductor substrate and having a pattern selectively exposing the substrate surface with a width not larger than a predetermined value; a semiconductor buffer layer epitaxially grown on said single crystal semiconductor substrate covering said insulative film and forming interfaces with said insulative film; and a semiconductor active layer epitaxially grown on said buffer layer.

The pattern of the insulative layer may be, for example, a line-and-space stripe pattern, mesh pattern, or a matrix pattern forming mesh shaped aperture. The source material for the epitaxial growth may be, for example, organic metal compound. In this case, the atmosphere during the epitaxial growth is preferably a high vaccum of $10^{-3}$ torr or higher vaccum.

Depletion layer (band bending) extends from the insulative layers embeded in an epitaxially grown buffer layer to make the buffer layer highly resistive. An integrated circuit device can be formed on the semiconductor layer epitaxially grown on the buffer layer. The side gate effect in this integrated circuit can be effectively suppressed.

DESCRIPTION OF THE PREFERRED EMBODIMENTS

Figure 1A:
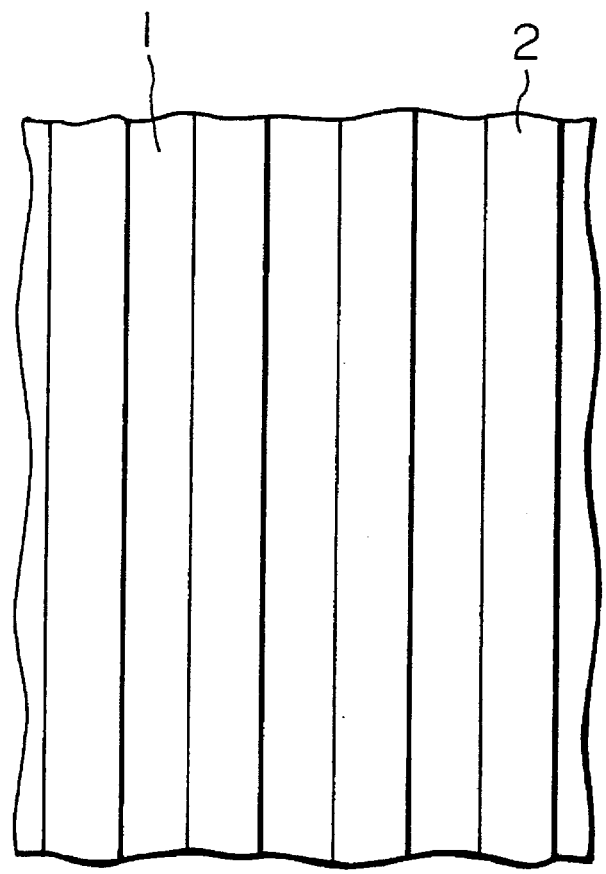
FIGS. 1A and 1B are partial plan and cross sectional views illustrating a semiconductor wafer during manufacture, according to an embodiment of this invention.

According to the basic concept of this invention, a patterned insulative layer is embedded in a semiconductor buffer layer to grow depletion layers (band bending) from the interface between the insulative layer and the semiconductor buffer layer into the buffer layer. The buffer layer is rendered highly resistive to suppress electric interference between circuit components in an integrated circuit.

The interface between the insulator and the semiconductor has an inteface level and deep traps. The band structure of the non-doped semiconductor region is fixed by this level and traps at the interface.

For growing semiconductor epitaxial layers on a semiconductor substrate covered by an insulative film pattern, such methods are preferably employed in which crystal growth proceeds through reaction on the substrate surface, selectivity of growth is high, and lateral growth on the insulator surface can be enhanced. For example, those epitaxial growth methods as metalorganic vapor phase epitaxy (MOVPE), gas source molecular beam epitaxy (GSMBE), metalorganic molecular beam epitaxy (MOMBE), chemical beam epitaxy (CBE), and vacuum chamical epitazy (VCE) can be employed to embed insulative layers in a semiconductor layer. Usually, no crystal growth occurs on an insulative film when reduced pressure MOVPE, GSMBE, MOMBE, or CBE is employed. For example, such MOVPE is disclosed in (7) K. Hiruma et al "Surface Migration and Reaction Mechanism during Selective Growth GaAs and AlAs by Metalorganic Chemical Vapor Deposition" Journal of Crystal Growth, Vol. 102 (1990), pp 717– 724, which is incorporated herein by reference.

In MOVPE, raw materials may be reacted in vapor phase and supplied to the growth surface. GSMBE can exhibit selectivity of the crystal growth more significantly, compared to MOVPE. This selectivity may be ascribed to the metalorganic source material being irradiated on the substrate surface in the form of a molecular beam and subjected to crystal growth through decomposition on the substrate surface. In other words, GSMBE is a method of crystal growth utilizing a surface reaction.

When a pattered insulative film is embedded with a semiconductor layer by MOVPE, the growth rate changes with the ratio of the area of the patterned insulative layer to the area of underlie semiconductor crystal exposed in the aperture of the patterned insulative film. The growth rate on such a semiconductor crystal surface in the neighborhood of the insulative film becomes larger than that on a semiconductor crystal surface remote from the insulative film. Therefore, the surface of a grown layer on a patterned insulative film by MOVPE may become minutely uneven.

Such an uneven grown surface is not observed when the crystal growth is done by GSMBE. Reference may be made to (8) E. Tokumitsu et al "Preparation of GaAs and $Ga_{1-x}Al_xAs$ Multilayer Structures Metalorganic Molecular Beam Epitaxy" Japan. Journal Appl. Phys. Vol. 25 (1986), pp 1211–1215, which is incorporated herein by reference. Thus, a flat grown surface can easily be obtained by GSMBE.

Usually, gas pressures in reduced pressure MOVPE and GSMBE are 20–30 torr and $10^{-4}$–$10^{-5}$ torr, respectively. In the newly developed vaccum chemical epitaxy (VCE), crystal growth is done under an atmosphere of a pressure of $10^{-3}$–$10^{-4}$ torr, which is higher than the pressure of GSMBE. Crystal growth of extremely superior selectivity is possible even under such high pressure range by VCE. Reference may be made to (9) Kuromiya et al "Development of Vaccum Chemical Epitaxy System" Solid State Technology, Japanese Version, Feb. 1990, pp 21–27, which is incorporated herein by reference.

The present inventor achieved experiment of selectively growing a semiconductor layer on a patterned insulative film by VCE. It was found that patterned insulative film formed on a GaAs substrate can be embedded in a GaAs crystal grown by VCE. The VCE growth of GaAs has selectivity dependent on the property of the underlie (in this case GaAs substrate and insulative film pattern). No deposition occurs on the insulative film, and crystal growth occurs only on the semiconductor crystal surface. Also, lateral growth can easily occur.

Also, the present inventor and his colleague performed crystal growth of GaAs on a GaAs substrate by MBE. When the preparatory treatment before growth is done sufficiently, it was confirmed that residual impurities on the substrate surface can be removed. Thus, shallow impurity levels which apt to exist in the neighborhood of the interface between the substrate and an epitaxially grown layer are not produced, thereby rendering the grown crystal highly resistive and reducing the side gate effect (e.g. see articles (1) and (2)).

Further, the present inventor and his colleague has proposed a method of etching a GaAs substrate by disposing a GaAs substrate in a pre-treatment chamber connectable to an MBE growth chamber without breaking vaccum, introducing a mixed gas of hydrogen chloride and hydrogen, and heating GaAs substrate to about 500° C., as a pre-treatment of substrate. This method has high controllability, provides good surface morphology of GaAs substrate, and can effectively remove the residual impurities.

According to this method, a desired cleaning effect can be obtained by etching the surface of a GaAs substrate by about 20–30 A. Reference may be made to (10) J. Saito et al "In situ Cleaning of GaAs Substrates with HCl Gas and Hydrogen Mixture Prior to MBE Growth" Journal of Crystal Growth, Vol. 90 (1989), p 322, and (11) J. Saito and K. Kondo "Effects of Etching with a Mixture of HCl Gas and $H_2$ on the GaAs Surface Cleaning in Molecular Beam Epitaxy" J. Appl. Phys. Vol. 67 (1990), p 6274, which are incorporated herein by reference.

By combining the technique of embeding a patterned insulative film and the technique of cleaning a semiconductor crystal surface, an insulative film can be embedded in a buffer layer and the depletion layer extending from the insulative film into the buffer layer can be expanded in the buffer layer render the buffer layer highly resistive. In this way, mutual electric interference between circuit elements can be suppressed.

Figure 1B:
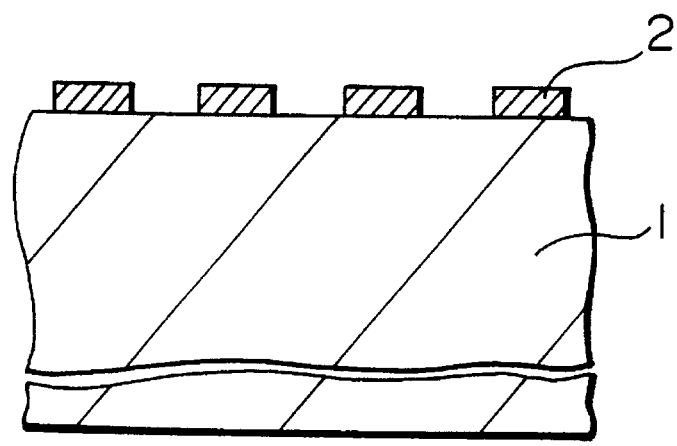
Figure 2:
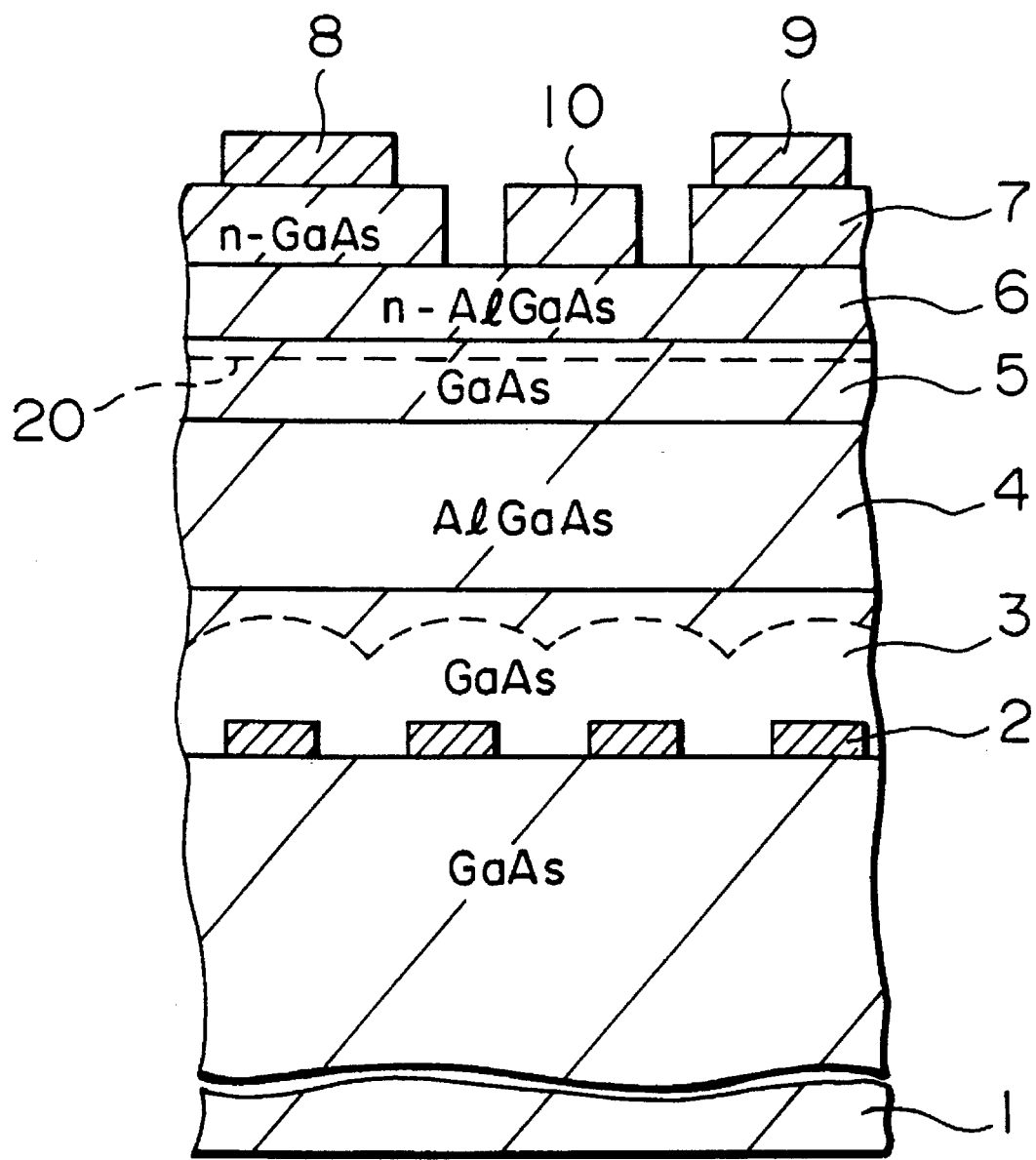
FIG. 2 is a partial cross section of a semiconductor device according to the embodiment of this invention illustrated in FIGS. 1A and 1B.

FIGS. 1A, 1B and 2 illustrate a semiconductor substrate according to an embodiment of this invention. FIG. 1a is partial plan view of a semiconductor substrate during manufacture, FIG. 1B is a partial cross selection of the semiconductor substrate corresponding to FIG. 1A, and FIG. 2 is a partial cross selection of a semiconductor device.

Figure 3:
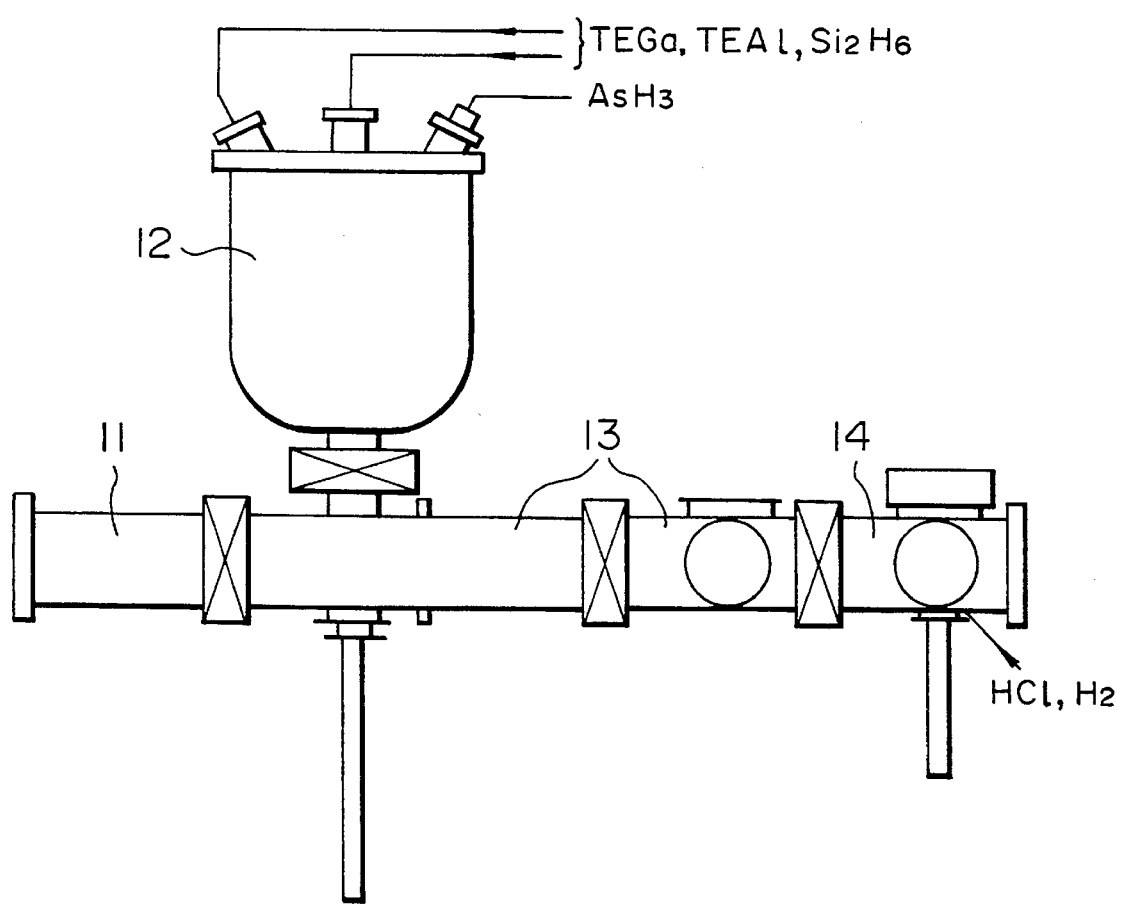
FIG. 3 is a schematic diagram showing a main part of a crystal growth system used in the embodiment of this invention illustrated in FIGS. 1A and 1B.

For growing semiconductor crystal layers of FIG. 2, a crystal growth system of FIG. 3 is used.

In FIG. 3, a substrate exchange chamber 11 is used for exchanging underlie substrate for crystal growth and a substrate after growth. An MBE growth chamber 12 is connected to the substrate exchange chamber 11 and performs crystal growth under high vaccum. A substrate transport vacuum chamber 13 connects the MBE growth chamber and a dry etching chamber 14 in which the surface of an underlie substrate before growth is dry-etched with a gas mixture of HCl and $H_2$.

The etched and cleaned substrate is transported to the MBE growth chamber 12 to which such source gases as $AsH_3$, triethylgallium (TEGa), triethylaluminum (TEAl), disilane ($Si_2H_6$) are supplied. Now, the steps for manufacturing a semiconductor device will be explained.

Referring to FIGS. 1A and 1B, a silicon nitride film 2 having a thickness of, for example, 0.2 μm is deposited on a GaAs substrate 1 having a crystalographic surface index of (100) by chemical vapor deposition (CVD). A photo resist film is spin-coated on the silicon nitride film 2. Parallel stripe pattern having a stripe width of 1 μm and stripe spacing of 1 μm is exposed in the photo resist film. Then the photo resist film is developed to obtain a resist mask. Using this resist mask as an etching mask, the silicon nitride film 2 is pattered by reactive ion etching (RIE) using $CF_4$ and $CHF_3$ as an etching gas, to produce stripes of a width 1 μm with a spacing of 1 μm.

Referring to FIG. 2, a GaAs substrate 1 having a patterned silicon nitride film 2 is set within the dry etching chamber 14 connected to the MBE growth chamber 12 through substrate transport vaccum chamber 13. Then, while supplying $H_2$ gas at a flow rate of 18 sccm, for example, the GaAs substrate is heated and kept at a temperature of 500° C. Then, HCl gas is introduced at a flow rate of 2 sccm to form $HCl/H_2$ mixed gas in the dry etching chamber 14, to etch the surface of the GaAs substrate 1 by about 50 A. The temperature of the GaAs substrate 1 is then naturally cooled down. When the temperature becomes about 200° C., the GaAs substrate 1 is transported to the MBE growth chamber 12 through the substrate transport vaccum chamber 13. The vaccum pressure in the substrate transport vaccum chamber 13 is always kept at an order of $10^{-8}$–$10^{-9}$ torr, to prevent the surface of the GaAs substrate 1 cleaned in the dry etching chamber 14 from being contaminated again. The transport time from the chamber 14 to the growth chamber 12 may be 2–3 min.

The GaAs substrate 1 loaded in the MBE growth chamber 12 is heated under irradiation of As molecular beam. The As molecular beam may be formed by heating metal arsenic, or thermally decomposing arsine ($AsH_3$). Here, As molecular beam is obtained from $AsH_3$. Sufficient amount of As molecular beam is supplied to prevent dissociation of As from the GaAs substrate.

Keeping the temperature of the GaAs substrate 1 at 550° C., triethylegallium (TEGa: Ga ($C_2H5)_3$) having a flow rate set at 0.5 sccm, for example, is irradiated on the substrate 1 to begin crystal growth of GaAs. The ambient pressure during growth is, for example, $4 \times 10^{-5}$ torr.

In this way, As molecular beam and TEGa are irradiated on the GaAs substrate 1 having a patterned silicon nitride film 2 to grow a non-doped GaAs single crystal buffer layer 3 on the exposed surface of the GaAs crystal.

Here, no deposition occurs on the silicon nitride film 2. While the non-doped GaAs buffer 3 is kept growing, the GaAs single crystal grown on the exposed GaAs substrate surface begin to grow laterally on the silicon nitride film 2 of a thickness of 0.2 µm, and becomes to be mutually connected on the silicon nitride stripe.

The non-doped GaAs buffer layer 3 is grown to a thickness of about 1 µm. In this state, the silicon nitride stripes are perfectly covered by the buffer layer 3. After the non-doped GaAs buffer layer is grown to cover the stripe-shaped silicon nitride film 2, triethylaluminum (TEAl:Al($C_2H_5)_3$) is further introduced at a flow rate of 0.2 sccm, for example. In this way, a non-doped AlGaAs buffer layer 4 is grown, for example, to a thickness of 0.2 µm. By inserting this wide gap layer, electric isolation of the epitaxial layer to be grown thereon and the substrate (and also the buffer layers) can be enhanced.

Then, controlling the introduction of TEAl and disilane ($Si_2H_6$), which is a dopant gas, by valve control, GaAs/AlGaAs hereto structure including a non-doped GaAs electron transfer layer 5, an n-type AlGaAs carrier supply layer 6 and an $n^+$-type GaAs cap layer 7 is grown. Here, the electron transfer layer is a layer in which carriers (electrons) are transferred under control of a gate voltage, and the carrier supply layer is a layer including dopant impurities and supplies charge carriers to the electron transfer layer.

Thereafter, part of the $n^+$-type GaAs cap layer is removed, and ohmic source and drain electrodes 8 and 9, for example, of AuGe/Au are formed on the $n^+$-type GaAs layer 7 on the both sides of a gate electrode 10, and a Schottky gate electrode 10, for example, of aluminum is formed on the n-type AlGaAs layer 6.

Hall measurement was performed on the laminate samples formed as described above wherein the doped impurity concentration in the n-type AlGaAs carrier supply layer 6 is $1.5 \times 10^{18}$ cm$^{-3}$ and AlAs composition is 0.3. It was confirmed that the non-doped GaAs electron transfer layer 5 has a two dimensional electron gas having mobility: $\mu_{77\,K}$=25000 cm$^2$/V·sec, and
concentration: $9.0 \times 10^{11}$ cm$^{-2}$.

HEMT integrated circuit samples were made using this hereto junction multilayer structure. Electric interference between the component elements, i.e. side gate effect, was measured. It was found that no variation in the threshold voltage Vth occurs in the HEMT up to a side gate voltage of 20 V when the distance to the side gate electrode is 10 µm. That is, extremely excellent and highly resistive buffer layer is obtained.

For reference, those samples as mentioned in the related art will cause variation in the threshold voltage when the side gate voltage becomes about 1–2 V, if the distance is set at the same value (10 µm).

Figure 4:
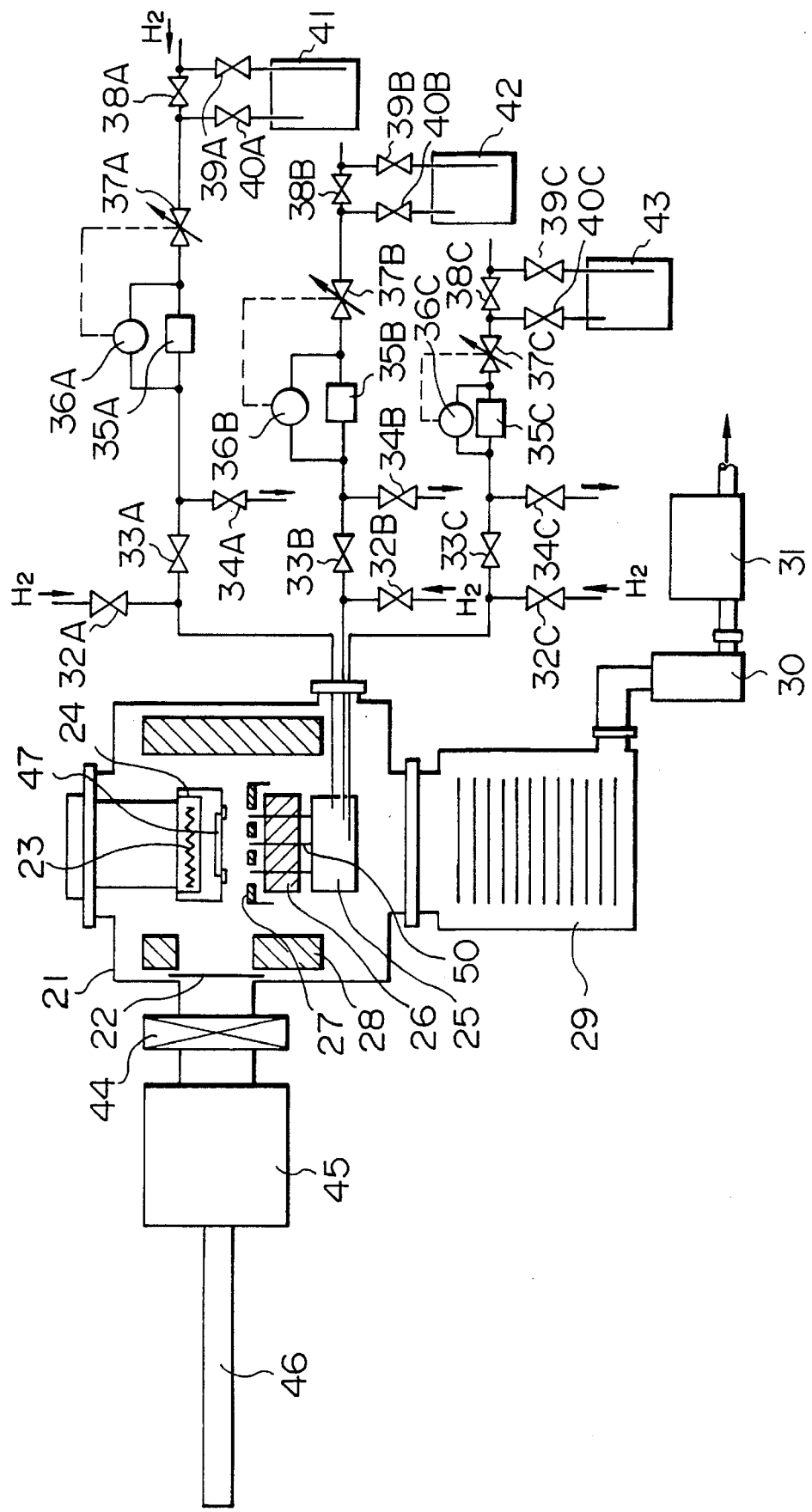
FIG. 4 is a schematic diagram showing a main part of a VCE growth system used in another embodiment of this invention.

FIG. 4 shows a VCE growth chamber used in another embodiment of this invention. The total system is as shown FIG. 3 wherein the MBE growth chamber 12 is substituted by the VCE growth chamber of FIG. 4.

In FIG. 4, reference numeral 21 represents a crystal growth chamber, 22 a shutter, 23 a substrate heater, 24 a substrate holder, 25 a manifold block, 26 warm water shroud, 27 a heat insulator plate, 28 a water-cooled shroud, 29 a turbo molecular pump, 30 a oil trap, 31 a rotary (mechanical) pump, 32A, 32B, and 32C hydrogen supply valves, 33A, 33B, and 33C gas supply valves, 34A, 34B, and 34C vent valves, 35A, 35B, and 35C flow elements, 36A, 36B, and 36C pressure sensors, 37A, 37B, and 37C variable leak valves, 38A, 38B, and 38C by-pass valves, 39A, 39B, and 39C inlet valves, 40A, 40B, and 40C outlet valves, 41 trimethylaminealane vessel, 42 trimethylaminegallane vessel, 43 trisdimethylaminoarsine vessel, 44 a gate valve, 45 a substrate transport chamber, 46 a substrate transport mechanism, 47 a GaAs substrate, and 50 a raw material gas ejecting cell.

In this embodiment, a patterned silicon nitride film is formed on a GaAs substrate, similar to the foregoing embodiment, and the GaAs substrate is introduced into the crystal growth chamber 21 after cleaning in the dry etching chamber.

The cleaned GaAs substrate 47 is transported through the substrate transport chamber 45 kept at a high vaccum of $10^{-8}$–$10^{-9}$ torr. When the substrate reaches in front of the crystal growth chamber 21, the gate valve 44 and the shutter 22 are opened and the substrate is transported into the crystal growth chamber 21 by the substrate transport mechanism 46 and set on the substrate holder 24.

The crystal growth chamber 21, the substrate transport chamber 45 and the substrate transport mechanism 46, especially the outer wall and main parts thereof, are mainly formed of stainless steel, and is connected to the turbo molecular pump 29 serving as a main evacuation system. The crystal growth chamber 21 can be evacuated to an ultra high vaccum of the order of $10^{-10}$–$10^{-11}$ torr. The water-cooled shroud 28 is disposed around the low material gas ejecting cell 50 and the substrate heater 23 in the crystal growth chamber 21 to prevent heating of the wall surface of the crystal growth chamber 21 by the radiation from the substrate heater 23.

The shutter 22 is provided in the neighborhood of the outer surface of the water-cooled shroud 28 at an intermediate location of the substrate transporting path from the substrate transport chamber 45 to the substrate holder 24 in the crystal growth chamber 21, to prevent heating of the gate valve 44 by the radiation from the substrate heater 23 and contamination of the gate valve 44 by the flying raw material molecular beam. The raw material gases supplied from the outside of the crystal growth chamber 21 are mixed in the manifold block 25 under the raw material gas ejecting cell 50, ejected through upward-oriented raw material ejecting cell 50, and irradiated on the surface of the GaAs substrate 47 downwardly set on the substrate holder 24. The warm water shroud 26 covers the surrounding of the raw material gas ejecting cell 50 and keeps the temperature of the raw material gas ejecting cell 50 at a constant temperature by adjusting the temperature of the warm water supplied therethrough. On the raw material gas ejecting cell side facing the GaAs substrate 47, a porous heat insulator plate 27 having a structure accommodating the raw material gas ejecting cell 50 is disposed to prevent excessive heating of the raw material ejecting cell 50 by the radiation heat when the GaAs substrate 47 is being heated.

The raw material gas introducing pipes, the manifold block 25, the warm water shroud 26, etc are formed of stainless steel. The raw material gas ejecting cell 50 standing upward from the manifold block 25 and the heat insulator plate 27 are formed of a refractory metal, e.g. tantalum.

This is because a refractory metal is strong in heat resistivity and easy to obtain a high purity material. It is not limited to tantalum and other refractory metal such as molybdenum and titanium can be used.

Warm water is supplied and circulated to the warm water shroud 26 from the outside of the crystal growth chamber 21. The temperature of the warm water is kept at a constant value by a thermostat warm water supply (not shown). The distance from the ejecting port of the raw material gas ejecting cell 50 and the substrate holder 24 is preferably less than the mean free path and is determined depending on the vaccum during epitaxial growth. In this embodiment, typical vaccum P during epitaxial growth is $2\times10^{-3}$ torr. In this state, mean free path $\lambda$ (cm) of the gas molecules can be represented by the following formula.

$$\lambda = 2.33 \times 10^{-20} \times T/Pd^2,$$

where T is the temperature of the gas molecules in K and d is the diameter of the gas molecule in cm.

Letting the gas temperature T be 400 K and the gas molecule diameter d be represented by that of hydrogen molecule, $2.75\times10^{-8}$ cm, the above-described formula will produce $\lambda=6.2$ cm.

In this embodiment, the distance between the ejecting port of the raw materiel gas ejecting cell 50 and the substrate holder 24 is set at 3 cm, based on the above analysis.

In this embodiment, those gas source materials are used for epitaxial growth, as trimethylaminegallane (TMAG: $(CH_3)_3$ N·$GaH_3$), trimethylaminealane (TMAA: $(CH_3)_3$ N·$AlH_3$), and trisdimethylaminoarsine (As $\{(N)\cdot(CH_3\}_2)_3$.

Because the vapor pressure of amine compound is very low, a gas control system including the variable leak valves 37A, 37B, and 37C, the pressure sensors 36A, 36B, and 36C and flow elements 35A, 35B, and 35C is used as shown in FIG. 4 in this embodiment.

Recently, such gas mass flow controllers capable of controlling low flow rate below 10 sccm at low pressure difference below 10 torr become available, and hence may substitute the above-discribed gas control system.

In the crystal growth chamber 21, trisdimethylaminoarsine is irradiated on the surface of the GaAs substrate 47 at a flow rate of 2 sccm, while heating the GaAs substrate 47 at a temperature of 550° C. Trimethylaminegallane is controlled at a flow rate of 0.5 sccm and introduced into the manifold block 25. Trimethylaminegallane is passed through the raw materiel gas ejecting cell 50 from the manifold block 25 and irradiated on the surface of the GaAs substrate 47, similar to trisdimethylaminoarsine. By these raw material supply, a non-doped GaAs buffer layer 3 (see FIG. 2) is grown.

By irradiating trisdimethylaminoarsine and trimethylaminegallane, no deposit appears on the surface of the silicon nitride film 2 (see FIG. 2) and a GaAs single crystal grows only on the GaAs crystal surface exposed between silicon nitride stripes. While this GaAs single crystal is grown to a thickness of about 1 µm, the GaAs crystal also grows in the lateral direction on the silicon nitride film 2, is connected mutually, and grows thereon. Finally, a non-doped GaAs buffer layer 3 as shown in FIG. 2 is grown. Here, the vaccum during epitaxial growth was about $2\times10^{-3}$ torr.

Thereafter, trimethylaminealane is additionally introduced to grow a non-doped AlGaAs buffer layer 4 (see FIG. 2) to a thickness of about 0.2 µm. Then, controlling the introduction of trimethyaminealane and trimethyaminesilane ($(CH_3)_3$ N·$SiH_3$), which is a dopant of amine compound, by the valve switching, the GaAs/AlGaAs hetero structure as shown in FIG. 2, i.e. the non-doped GaAs electron transfer layer 5, the n-type AlGaAs carrier supply layer 6 and the $n^+$-type GaAs cap layer 7, is formed as shows in FIG. 2.

A HEMT integrated circuit device utilizing the hereto junction multilayer structure as described above was formed and measured the electric characteristics. The result was almost similar to those of the foregoing embodiment.

In the above-described embodiments, the patterned insulative film formed on the GaAs substrate was made of silicon nitride. This insulative film, however, can also be made of other insulative films having different electronic configuration and crystal structure than those of the semiconductor layer, such as silicon oxide film, GaAS oxide film, etc can also be used.

Figure 5A:
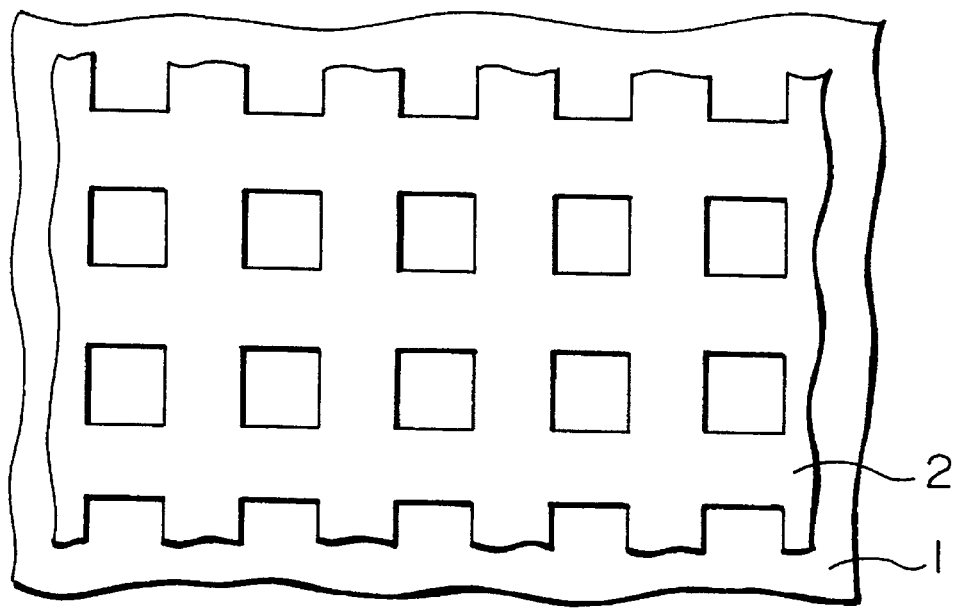
FIGS. 5A and 5B are plan views showing other configurations of the selective insulative film on a substrate.
Figure 5B:
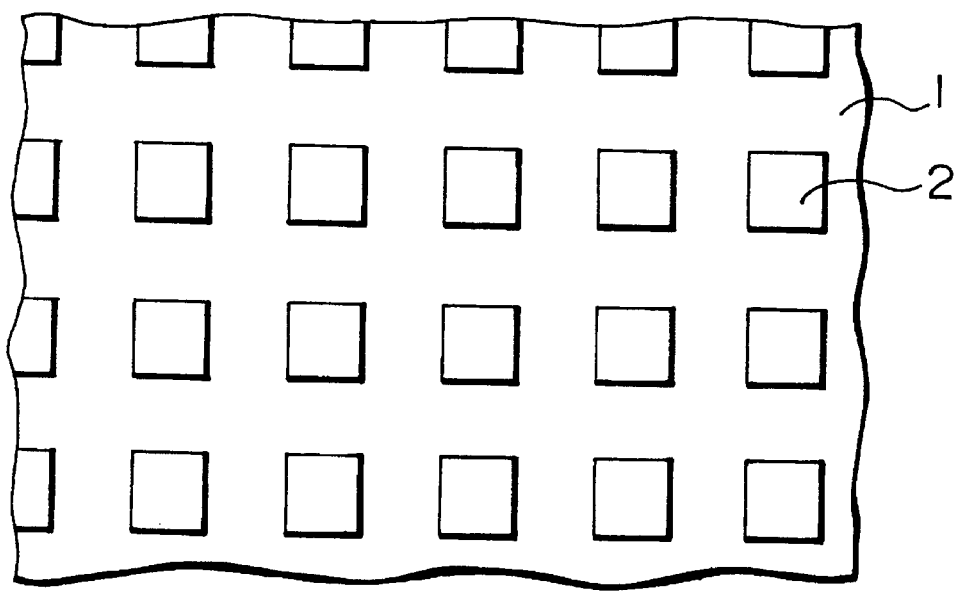

Also, the pattern of the insulative film was stripes of 1 µm width and 1 µm spacing. The pattern, however, can also be varied variously. For example, a mesh like pattern having crossed stripes leaving matrix-like apertures of a width of about 1 µm as shown in FIG. 5A or a matrix pattern leaving crossed stripe spacings, having a stripe width of about 1 µm as shown in FIG. 5B can also be used.

For growing depletion layers on the exposed underlie crystal surface to completely cover the exposed surface, the spacing of the insulative layer pattern is preferably selected about 1 µm or less. However, even when the exposed underlie crystal surface cannot be perfectly covered by the depletion layer, the effect of extending depletion layer exists. In such a case, the width of the opening in the pattern of the insulative layer may be about 1.5 µm or less.

Also, the width of the size of the insulator pattern is important for growing good single crystals thereon. The width or size may be selected not greater than about 1 µm.

Also, it is preferable to avoid the effect of the depletion layer to the carrier transfer. For example, in the case of HEMT, the two dimensional electron gas is preferably spaced sufficiently from the insulative film so that the depletion layer extending from the insulative film does not reach the two dimensional electron gas.

Further, TEGa and TMAl are used as the metal organic compound source material for GSMBE and TMAG, TMAA, trisdimethylaminoarisine, and trimethylaminesilane are used as the amine and amino compound source material for VCE. Other metal organic compound materials, amine compound materials or amino compound materials can also be used.

Yet further, GaAs/AlGaAs hereto structure was employed as the semiconductor materials for the substrate and the epitaxial layer. Other compound semiconductor materials can also be used almost without any limitation. For example, the substrate may be InP or GaSb. The epitaxial layers may be InP, InGaP, InGaAs, InAlAs, GaSb, InGaSb, InAlSb, etc. It is also possible to use quaternary mixed crystals. Also, it is possible to epitaxially grow GaAS or SiGe on Si substrate.

It will be apparent for those skilled in the art that various devices other than HEMT can be manufactured in the epitaxially grown semiconductor multilayers, for example, MESFET.

Although the present invention has been described along the preferred embodiments of the invention, it is not limited to thereto. It will be apparent for those skilled in the art that various substitutions, alterations, improvements, combinations, etc can be made within the spirit and scope of the invention.

What is claimed is:

1. A method of manufacturing a semiconductor device comprising the steps of:

forming an insulative film on a single crystal semiconductor substrate;

patterning said insulative film to selectively expose the surface of said single crystal semiconductor substrate;

then epitaxially growing a non-doped buffer layer on the whole surface of said single crystal semiconductor substrate;

epitaxially growing a semiconductor multilayer including an active layer where carriers are transported in a resultant device, on said non-doped buffer layer; and forming first and second electrodes on said semiconductor multilayer, said first and second electrodes being mutually electrically connected through said active layer.

2. A method of manufacturing a semiconductor device according claim 1, wherein said step of patterning the insulative film leaves line-and-space stripe pattern.

3. A method of manufacturing a semiconductor device according to claim 1, wherein said step of patterning the insulative film removes the insulative film in a mesh pattern.

4. A method of manufacturing a semiconductor device according to claim 1, wherein said step of patterning the insulative film leaves the insulative film in a mesh pattern.

5. A method of manufacturing a semiconductor device according to claim 1, wherein said epitaxial growth steps use a raw material of metalorganic compound.

6. A method of manufacturing a semiconductor device according to claim 5, wherein said steps of epitaxial growth are done under an ambient pressure of $10^{-3}$ torr or higher vacuum.

7. A method of manufacturing a semiconductor device according to claim 1, wherein said steps of epitaxial growth use a raw material of amine-based compound.

8. A method of manufacturing a semiconductor device according to claim 7, wherein said steps of epitaxial growth is done under an ambient pressure of the order of $10^{-3}$–$10^{-4}$ torr.

9. A method of manufacturing a semiconductor device according to claim 1, further comprising the step of etching the exposed surface of said single crystal semiconductor substrate after said step of patterning said insulative film.

10. A method of manufacturing a semiconductor device according to claim 1, wherein said insulative film is formed from silicon nitride, silicon oxide or an oxide of a compound semiconductor.

11. A method of manufacturing a semiconductor device according to claim 1, wherein said single crystal semiconductor substrate is a GaAs substrate, and said step of epitaxially growing a non-doped buffer layer comprises growing a GaAs layer on the whole surface of said single crystal semiconductor substrate by irradiating an As molecular beam and a molecular beam of metal organic compound with Ga to the surface of single crystal semiconductor substrate.

12. A method of manufacturing a semiconductor device according to claim 1, wherein said step of epitaxially growing a non-doped buffer layer further comprises the step of epitaxially growing an AlGaAs layer on said GaAs layer.

13. A method of manufacturing a semiconductor device according to claim 1, wherein said single crystal semiconductor substrate is a GaAs substrate, and said step of epitaxially growing a non-doped buffer layer comprises epitaxially growing a GaAs layer on the whole surface of said single crystal semiconductor substrate by supplying the gas comprising amine with Ga and As to the surface of said single crystal semiconductor substrate.

14. A method of manufacturing a semiconductor device according to claim 13, wherein said step of epitaxially growing a non-doped buffer layer further comprises the step of epitaxially growing an AlGaAs layer on said GaAs layer.

15. A method of manufacturing a semiconductor device according to claim 1, wherein said step of epitaxially growing a semiconductor multilayer comprises the steps of:

growing a non-doped GaAs layer over said buffer layer; and growing an n type AlGaAs layer on said non-doped GaAs layer.

16. A method of manufacturing a semiconductor device according to claim 15, wherein said step of forming electrodes comprises the steps of:

epitaxially growing an n type GaAs layer on said n type AlGaAs layer; and removing selectively said n type GaAs layer and exposing partially the surface of said n type AlGaAs layer.

17. A method of manufacturing a semiconductor device according to claim 16, wherein said step of forming electrodes further comprises the steps of:

forming a pair of Ohmic electrodes serving as current electrodes on said n type GaAs layer; and forming a Schottky electrode serving as a gate electrode on said n type AlGaAs layer.

18. A method of manufacturing a semiconductor device according to claim 1, wherein material of said insulative film, area of the exposed substrate, and material of said non-doped buffer layer are so selected that a depletion layer covers a whole surface of the substrate.

19. A method of manufacturing a semiconductor device comprising the steps of:

forming an insulative film on a single crystal semiconductor substrate;

patterning said insulative film to selectively expose the surface of said single crystal semiconductor substrate;

then epitaxially growing a non-doped buffer layer on the whole surface of said single crystal semiconductor substrate;

epitaxially growing a semiconductor multilayer including an active layer where carriers are transported in a resultant device, on said non-doped buffer layer;

forming first and second current electrodes on said semiconductor multilayer, said first and second electrodes being mutually electrically connected through said active layer; and forming a control electrode for controlling a current flowing between said first and second current electrodes on said semiconductor multilayer.

20. A method of manufacturing a semiconductor device comprising the steps of:

forming an insulative film on a single crystal semiconductor substrate;

patterning said insulative film to selectively expose the surface of said single crystal semiconductor substrate;

then epitaxially growing a non-doped buffer layer on the whole surface of said single crystal semiconductor substrate;

epitaxially growing a semiconductor multilayer including an active layer where carriers are transported in a resultant device, on said non-doped buffer layer; and forming electrodes for allowing a current to flow therebetween through said active layer on said semiconductor multilayer.

* * * * *

UNITED STATES PATENT AND TRADEMARK OFFICE
CERTIFICATE OF CORRECTION

PATENT NO. : 5,622,891
DATED : Apr. 22, 1997
INVENTOR(S) : SAITO

It is certified that error appears in the above-indentified patent and that said Letters Patent is hereby corrected as shown below:

TITLE PAGE: [56] References Cited:
    Page 2, the second reference, change "Yokohama et al." to --Yokoyama et al.--.

Col. 1,   line 31, change "hereto" to --hetero--;
         line 33, change "hereto" to --hetero--;
         line 34, change "Field" to --A field--.

Col. 7,   line 46, change "hereto" to --hetero--.

Col. 8,   line 2, change "hereto" to --hetero--;
         line 14, after "shown" insert --in--.

Col. 10, line 20, change "shows" to --shown--;
         line 22, change "hereto" to --hetero--;
         line 63, change "hereto" to --hetero--.

Col. 12,   line 5 (Claim 12, line 2), change "1" to --11--.

Signed and Sealed this

Ninth Day of September, 1997

Attest:

BRUCE LEHMAN

Attesting Officer

Commissioner of Patents and Trademarks